METHOD OF MANUFACTURING A SEMICONDUCTOR DEVICE COMPRISING A FIELD-EFFECT TRANSISTOR

Filed July 1, 1968 3 Sheets-Sheet 1

INVENTOR.
JACQUES THIRÉ
MICHEL DE BREBISSON
BY JEAN-CLAUDE FROUIN

AGENT

INVENTORS
JACQUES THIRÉ
MICHEL DE BRÉBISSON
BY JEAN-CLAUDE FROUIN

AGENT

INVENTORS
JACQUES THIRÉ
MICHEL DE BREBISSON
BY JEAN-CLAUDE FROUIN

AGENT

United States Patent Office 3,595,714

Patented July 27, 1971

3,595,714
METHOD OF MANUFACTURING A SEMICONDUCTOR DEVICE COMPRISING A FIELD-EFFECT TRANSISTOR

Jacques Thire, Caponiere-Caen-Calvados, Michel de Brebisson, Richemond-Caen, and Jean-Claude Frouin, Defense-Passive-Caen, France, assignors to U.S. Philips Corporation, New York, N.Y.

Filed July 1, 1968, Ser. No. 741,730
Claims priority, application France, June 30, 1967, 112,637
Int. Cl. H01l 7/36, 7/44
U.S. Cl. 148—175 3 Claims

ABSTRACT OF THE DISCLOSURE

A method of making a junction field effect transistor, by steps compatible wtih the planar technology is described. Two epitaxial layers of the same type are deposited on a substrate of the opposite type, with a buried layer of the opposite type provided between the epitaxial layers. The buried layer is maintained spaced from the substrate, to define an isolation zone for the transistor, and spaced from the surface, to define a channel region of the original epitaxial material underneath a diffused gate electrode.

The invention relates to a method of manufacturing a semiconductor device comprising an epitaxial layer of the one conductivity type deposited on a substrate of the opposite conductivity type, which layer is divided into electrically isolated islands, the device comprising a field-effect transistor having a channel of the one conductivity type formed by a portion of the epitaxial layer, while a first control-electrode of said transistor is diffused from the surface of the epitaxial layer.

In the manufacture of monolithic integrated circuits various active semiconductor elements such as diodes, transistors etc. or passive semiconductor elements such as resistors, capacitors etc. are provided simultaneously by a minimum number of treatments on a substrate.

The treatments are carried out by known techniques such as alloying, diffusion, epitaxial growth or deposition of thin layers. The desired properties of the various elements sometimes require, however, treatments which are not compatible and some of which may even be harmful to elements not directly involved. Moreover, the electrical isolation of the elements from each other is conditioned by the circuit to be manufactured with respect to polarity or conductibility, requirements which have to be in harmony with said properties of the elements.

It is common practice to isolate the various elements of an integrated circuit by enclosing them each in an island which is bounded on the bottom side by a deep layer of the conductivity type opposite that of the island including the element and at the edges by diffused zones of the same conductivity type as said deep layer, said zones penetrating through the layer(s) including the island down to the deep subjacent layer and surrounding the elements completely. The island thus formed for each element may be electrically separated by reverse polarisation of the junction formed with the further part of the body.

A field-effect transistor arranged in a monolithic semiconductor body which comprises further active elements such as pnp- and npn-transistors or diodes in a number of said isolated islands has to satisfy requirements which are not always compatible in the known techniques.

The channel of a field-effect transistor preferably has a uniform, comparatively high resistivity in order to raise the permissible operational voltage, which is achieved by forming this channel by a portion of the epitaxial layer of the desired conductivity type instead of diffusing impurities of said conductivity type into a layer of the opposite conductivity type. The conductivity type chosen is not necessarily that of the substrate and the choice is made in accordance with the possibilities or requirements of the further elements of the circuit and with the desired insulation.

Therefore, the channel of the field-effect transistor is often formed in an epitaxial layer on a substrate of the opposite conductivity type. In this case the zones of the control-electrode, termed the gate of the transistor, may be provided like in known methods by local diffusion from the surface of said epitaxial layer, while a portion of the substrate located below said layer is connected to the surface of the device preferably by a diffused zone of such geometry that it determines the region forming the channel and surrounds it completely. Such a transistor can, however, not be insulated from the further part of the device, since part of the control-electrode is formed by a portion of the substrate which thus assumes the voltage of said electrode, whereas a different voltage is required for the other elements in or on the substrate. Moreover, the substrate is often soldered to a conductive header.

When the semiconductor substrate is of the same conductivity type as the channel, a local diffusion can be carried out from the surface of the substrate, instead of using a portion of the substrate to form the buried portion of the control-electrode. This structure is described in French patent specification No. 1,420,391. This structure comprises apart from one or more field-effect transistors, one or more bipolar transistors (pnp- or npn-transistors, for example), arranged in a monolithic semiconductor device. In this structure the substrate forms a portion of the collector of the bipolar transistor as well as the epitaxial layer deposited on said substrate. Thus the various elements of the circuit are not completely isolated from each other.

The present invention has for its object to isolate in a monolithic semiconductor device comprising various semiconductor elements a field-effect transistor having an epitaxial channel, when the substrate of the device is of the conductivity type opposite that of the epitaxial layer, while a portion of the epitaxial layer forms the channel of this transistor, the manufacture of said transistor being nevertheless compatible with that of other elements of the device.

According to the invention a method of the kind set forth is characterized in that a second control-electrode is obtained by the diffusion of a local buried layer of the opposite conductivity type from a pre-diffused region provided on the surface of a first epitaxial layer prior to the deposition of a second epitaxial layer, the first and the second epitaxial layers being of the same one conductivity type, and by the diffusion of a zone of the opposite conductivity type from a region on the surface of the second epitaxial layer, which zone extends down to said buried layer, together with which it surrounds an island-shaped portion of the epitaxial layer, the island forming the channel of the field-effect transistor.

The field-effect transistor is isolated from the substrate by providing such a thickness for the first epitaxial layer that subsequent to the diffusion of the local buried layer a portion of the first epitaxial layer with the initial doping is left between said buried layer and the substrate, while the composite epitaxial layer is divided into isolated islands. The thickness of the remaining portion of the first epitaxial layer between the buried layer and the substrate is chosen as large as possible to reduce parasitic capacitance and the effect of parasitic transistors.

The resultant field-effect transistor which is completely isolated exhibits, in addition, the advantages of an epitaxial channel, that is to say, a high and uniform resistivity and hence a high permissible voltage and a satisfactory reproduceability, since the epitaxial growth can be repeated accurately and hence subsequent diffusions can be carried out with great accuracy.

There may, for example, be carried out local isolating pre-diffusions prior to the first epitaxial deposition; after the deposition of the first epitaxial layer isolating diffusions in the same form as the pre-diffusions are carried out on the surface thereof and at the same time the buried layer of the control-electrode of the field-effect transistor is arranged. After the deposition of the second epitaxial layer isolating diffusions in the same form as the preceding diffusions are again carried out on the surface thereof, while simultaneously the surface region of the electrode of the field-effect transistor is diffused.

Between these various stages other diffusions of different conductivity types may be performed by known techniques in order to arrange other active or passive circuit elements in the same semiconductor body.

The structure of the field-effect transistor according to the invention arranged in the two successive layers of a composite epitaxial layer on a substrate of the opposite conductivity type permits of combining its manufacture with that of other semiconductor devices.

For the second epitaxial layer it is preferred to use the same impurity concentration and the same resistivity as those of the first epitaxial layer.

The invention furthermore relates to semiconductor devices comprising a field-effect transistor and being manufactured by a method according to the invention.

The invention will now be described more fully with reference to the accompanying drawing.

FIGS. 1*a* to 1*b* are diagrammatic sectional views taken on line I—I in FIG. 2 of a semiconductor body in various stages of manufacture by the method according to the invention.

It should be noted that the figures do not show the masking surface layers of, for example, silicon oxide. No reference is made thereto in the description because the application thereof and the provision of windows therein for masking purposes may be carried out in a conventional manner. Moreover, the pre-diffusions of impurities to be subsequently diffused are not always mentioned.

The example chosen is that of a transistor comprising an n-type channel in an n-type epitaxial layer, but in the same manner a transistor comprising a p-type channel in a p-type epitaxial layer may be manufactured. For this purpose it is only necessary to reverse the conductivity types.

Figure 1:
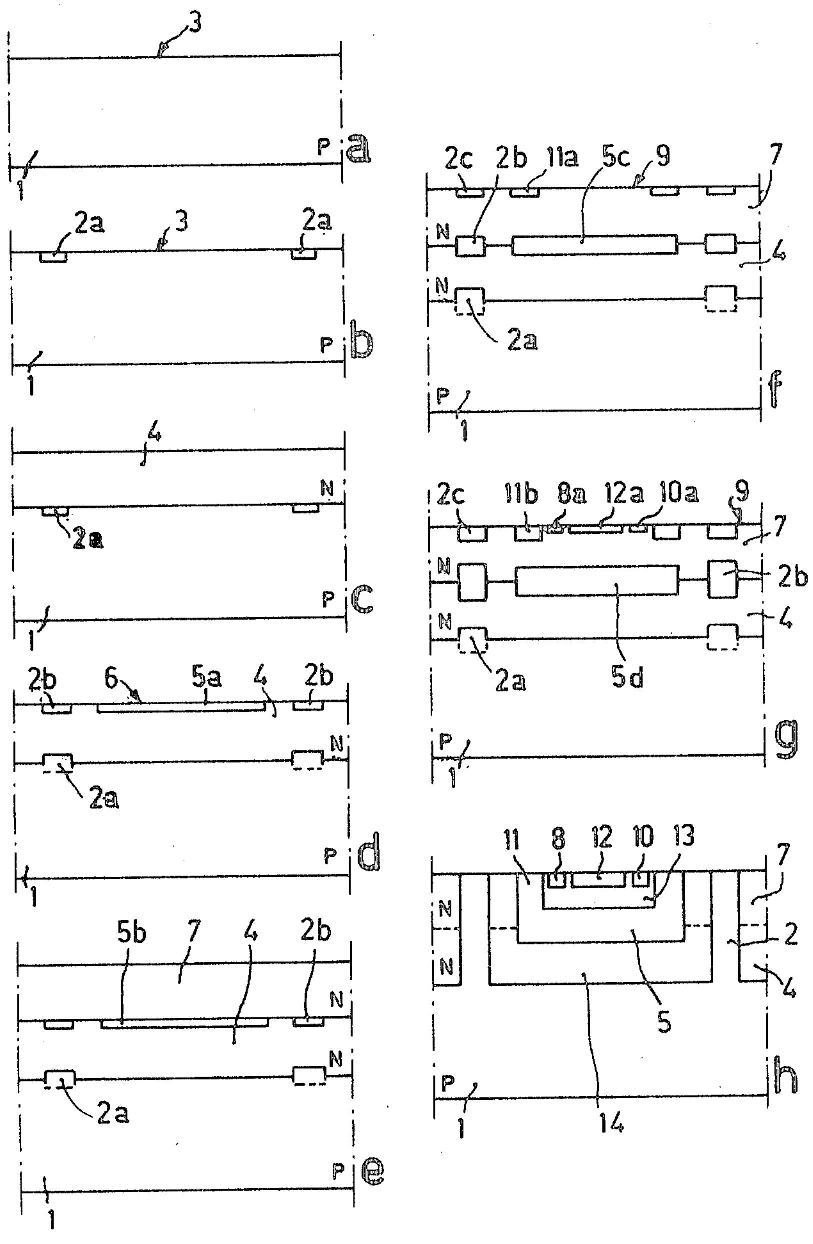

On a p-type monocrystalline silicon body 1 (FIG. 1*a*), on the surface 3, a pre-diffusion is carried out in a region 2*a* (FIG. 1*b*), the shape of which corresponds with that of the isolation zones forming the edges of the insulated islands. The next stages are the epitaxial deposition of a layer 4 throughout the prepared surface 3 with a low impurity concentration determining the conductivity type opposite that of the body or the substrate 1 (FIG. 1*c*).

The surface 6 of the epitaxial layer 4 is then subjected to a pre-diffusion in a region 2*b* (FIG. 1*d*) corresponding with the region 2*a* and in a region 5*a* having the desired configuration of the buried portion of the control-electrode of the transistor.

An epitaxial layer 7 (FIG. 1*e*) is then deposited on the whole surface 6 of the first layer 4 with an impurity concentration equal to that of the first layer 4, determining the same conductivity type.

The surface 9 of the second epitaxial layer 7 is then subjected to a pre-diffusion in a region 2*c* (FIG. 1*f*) corresponding with the regions 2*a* and 2*b* and in a region 11*a* having the desired configuration of the surface zone which extends to the buried region of the control-electrode of the transistor.

A diffusion of the opposite conductivity type (p) is carried in a region 12*a* to form the surface region of the control-electrode (FIG. 1*g*) from the surface 9. The geometry of this region is preferably chosen so that it is adjacent the region 11*b* so that the final control-electrode 11, 12 surrounds the channel 13 completely between the source electrode 8 and the drain electrode 10. A last diffusion of the one conductivity type (n) serves to form the contact zones of the channel at 8*a* and 10*a*.

After these consecutive diffusions the zones 2*a*, 2*b* and 2*c* form together the edges of the islands, whereas the zone 11*b* extends down to the buried zone 5*f* to form the second portion of the control-electrode, the diffusions 12*a* and 5*d* attaining such a depth that the desired thickness of the epitaxial layer is left for the channel. FIG. 1*h* shows the resultant transistor.

The buried portion 5 of the control-electrode comprises a contact zone 11 and the first control-electrode is designated by 12. The channel 13 comprises a zone 8, the source zone, and a zone 10, the drain zone, both having a very low resistivity. The island formed by the zone 14 isolates the transistor from the substrate 1 and from other elements in the body.

Figure 2:
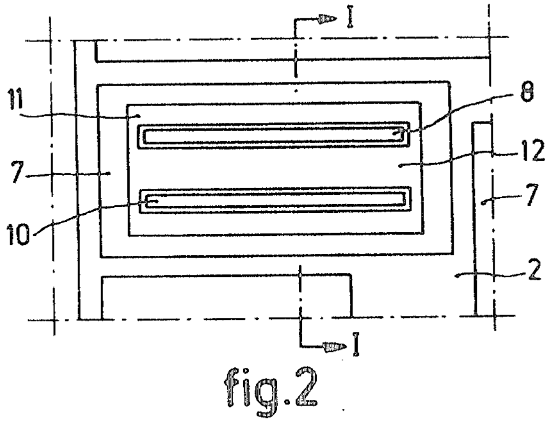
FIG. 2 is a diagrammatic plan view of said transistor.

The transistor is shown in the plan view of FIG. 2, where corresponding parts are designated by the same reference numerals. It will be obvious that the two control-electrodes are interconnected and form an electric unit. This is, however, not necessary and the method according to the invention permits of manufacturing a field-effect transistor of any desired geometry.

Figure 3:
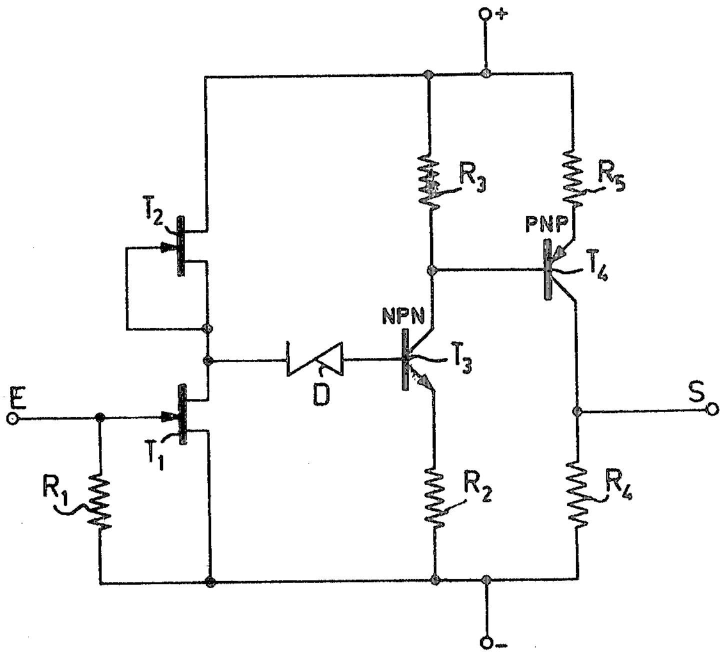
FIG. 3 shows the circuit diagram of an amplifier comprising inter alia field-effect transistors and complementary, bipolar transistor.

The circuit diagram of FIG. 3 is that of an amplifier having a high input impedance and low noise, in which field-effect transistors and bipolar transistors and a Zener diode in a monolithic semiconductor device according to the invention are employed. The input of the amplifier is denoted by E, the output by S. The field-effect transistor $T_1$ involves a high input impedance.

The field-effect transistor $T_2$, which is identical with $T_1$, forms a limiter which allows a very high dynamic load of $T_1$ and which has a low direct-voltage resistance. The transistor $T_1$ therefore provides a high amplification.

The diode D provides an uninterrupted connection with voltage transposition; the dynamic impedance is, however, low. The complementary transistors $T_3$ and $T_4$, which are connected as amplifiers, allow a very low direct voltage supply. The resistors $R_1$ to $R_5$, connected to said elements, are not described further, since they can be provided in a semiconductor body in known manner. They may be diffused or provided in thin layers.

Figure 4:
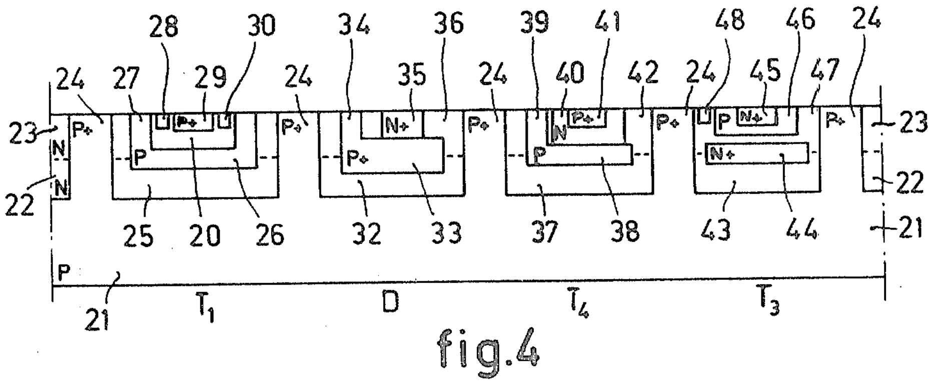
FIG. 4 is a diagrammatic sectional view of a semiconductor body in which relatively isolated active elements of the circuitry of FIG. 3 are integrated by the method according to the invention.

Other elements of this device are shown schematically in FIG. 4. This figure shows a field-effect transistor equal to $T_1$ or $T_2$, a diode having an abrupt junction and two complementary transistors $T_3$ and $T_4$. These elements are arranged in a body having a layer composed of the epitaxial layers 22 and 23 deposited on a substrate 21 of the opposite conductivity type. In this example the layer is of the n-type conductivity and the substrate 21 of the p-type conductivity.

Each active element is arranged in an electrically insulated island and the diffused zones 24, which extend down to the substrate 21, separate the islands from each other. In a first island the field-effect transistor is arranged whose channel 20 comprises two contact zones 28 and 30, the source electrode and the drain electrode. The surface region 29 of the control-electrode is diffused from the surface of the epitaxial layer as well as the contact zone 27 of the second control-electrode, whereas the deeper portion thereof is formed by the buried layer 26, which is diffused from the surface of the first layer 22 of the epitaxial deposition. The portion 25 of said layer isolates the transistor from the substrate 21.

The diode arranged in a second island 32 comprises a surface region 35, serving as a cathode and diffused from the surface of the layer 23, and a buried region 33, serving as an anode and diffused from the surface of the layer 22. The two diffusions of the regions 33 and 35 are performed in common so that an abrupt junction is obtained, which is conducive to the properties of the diode.

The php-transistor arranged in a third island comprises an emitter 41, diffused from the surface of the layer 23, and a base 40, diffused from the same surface. The collector of this transistor is formed by a buried layer 38, diffused from the surface of the layer 22, and a contact zone 39, diffused from the surface of the layer 23. The collector is isolated by the portion 37 of the epitaxial layer 22 left free after the various thermal treatments beneath the buried layer 38 from the substrate 21.

The npn-transistor arranged in a fourth island is of a conventional structure. This transistor comprises a diffused emitter 45, a diffused base 46 and a collector formed by the portion of the epitaxial layer located in the island 43 and a buried layer 44 of low resistivity, diffused from the surface of the first layer 22, this collector having a contact zone 48.

It will be obvious that the various above-mentioned elements arranged in the semiconductor body are compatible with each other, while the treatments required for them are the same as those described with reference to FIGS. 1*a* to 1*h* and that the elements are satisfactorily isolated from each other, when the substrate and the islands are polarized in the required manner.

With the field-effect transistor it is usually possible to apply a voltage to the island 25 which blocks the junctions between this island and the electrode 26 and between this island and the substrate 21, so that this transistor is isolated from the further part of the body. It is sometimes also possible to accommodate more e.g. identical elements in some of the said isolated islands.

The device described above is given only by way of example. Apart from or instead of said semiconductor elements other active or passive elements may be provided by corresponding, compatible treatments. By reversing the conductivity types mentioned also compatible elements may be obtained, for example, in a monolithic device comprising an n-type semiconductor body and a p-type epitaxial layer.

In the manufacture of the device shown in FIG. 3 it is advantageous to diffuse simultaneously the buried layers 26, 38 and 33 and the intermediate portion of the insulating zones 24. Also the regions 29 and 41, as well as the zones 35, 40, 28, 30 and 45 and the zones 27, 34 and 39 and the upper parts of the insulating zones 24 may be diffused simultaneously.

By way of example, the main stages of the manufacture of a field-effect transistor by the method according to the invention will now be described (see also FIGS. 1*a* to 1*h*).

On a p-type monocrystalline silicon body of a thickness of about 150$\mu$, having a resistivity of about 5 to 10 ohm. cm. (1 in FIG. 1*a*) $p^+$-type boron is diffused on the surface 3 in the region 2*a* around the area intended for the transistor (FIG. 1*b*) to form the isolating zones constituting the edge of the insulating island. The surface concentration is $10^{19}$ to $10^{20}$ at./cc.

After the removal of the oxide layer resulting from the preceding diffusion, a first epitaxial layer of n-type conductivtiy is deposited with an impurity concentration of about $10^{15}$ to $10^{16}$ at./cc. to a thickness of about 10 to 15$\mu$ (4 in FIG. 1*c*).

On this first epitaxial layer a second insualting boron pre-diffusion is carried out in a region 2*b*, which corresponds with the region 2*a*, which regions have the same properties.

Simultaneously with this pre-diffusion the p-type prediffusion region 5*a* is formed with a surface concentration of $10^{19}$ to $10^{20}$ at./cc. to form the buried layer of the control-electrode of the transistor.

Then the oxide layer formed during the preceding diffusion is removed and a second epitaxial layer is deposited in the same manner as the first one with the same conductivity type and the same concentration to a thickness of 5 to 10$\mu$ (7 in FIG. 1*e*).

On this second epitaxial layer a third boron prediffusion is carried out in the region 2*c*, which corresponds with the regions 2*a* and 2*b* so that the zones 2*c* have the same properties as the zones 2*a* and 2*b*. During the various treatments for the manufacture of the transistor the three diffusions of 2*a*, 2*b* and 2*c* meet across the thickness of the two epitaxial layers and form the zones 2 (FIG. 1*h*) for the insulation of the island in which the transistor is accommodated. Simultaneously with this third diffusion the pre-diffusion zone 11*a* (boron) is carried out to form the contact zone of the electrode, the surface concentration being $10^{19}$ to $10^{20}$ at./cc. The diffusion zone 11 extends across the thickness of the second epitaxial layer down to the buried layer to form an uninterrupted region 5, 11 of p-type conductivity, which forms one of the control-electrode zones of the transistor.

At 12*a* boron is then diffused with a surface concentration of $10^{18}$ to $10^{19}$ at./cc. to form the second control-electrode zone of the transistor.

Phosphorus is then diffused in the regions 8*a* and 10*a* (FIG. 1*g*) with a surface concentration of about $10^{21}$ at./cc., these zones ($n^+$-type) forming the source and drain zones of the transistor.

The device is finished by applying the contacts, for example, by metal deposition in vacuo and by mounting it in a conventional manner in an envelope.

The embodiments described above may, of course, be modified within the scope of the invention by using other equivalent technical means. For example, other impurities and other impurity concentrations may be used. In a monolithic semiconductor device may furthermore be included capcitors. Instead of silicon oxide, for example silicon nitride may be used.

What is claimed is:

1. A method of manufacturing a semiconductor device containing a field effect transistor, comprising the steps:

(a) epitaxially depositing a first layer of the one conductivity type on the surface of a substrate of the opposite conductivity type, (b) prediffusing a first region of the opposite conductivity type into the surface of the first layer, (c) epitaxially depositing a second layer of the one conductivity type on the surface of the first layer to bury the first region, (d) diffusing from the surface of the second layer a second region of the opposite conductivity type down to and to connect to the first region, (e) diffusing from the surface of the second layer a third region of the opposite conductivity type, said third region being adjacent the second region and being located over the first region, (f) providing by diffusion an isolation region of the opposite conductivity type extending through both epitaxial layers and surrounding but spaced from the first, second, and third regions, (g) said deposition and diffusion steps being carried out under conditions such that the first region and the second region at all times remain spaced from the substrate and the isolation region and form together an opposite type cup-shaped second control electrode which surrounds the third region as a first control electrode, forming between the first and third regions a one-type channel region of the field effect transistor constituted of the material of the second epitaxial layer, (h) and forming at the surface of the second layer between the first and second control electrodes spaced source and drain connections to the type material of the second epitaxial layer.

2. A method as set forth in claim 1 wherein the first and second epitaxial layers have the same impurity concentration ad resistivity.

3. A method as set forth in claim 2 wherein source and drain connection zones of the one conductivity type are diffused into the surface of the second layer.

References Cited

UNITED STATES PATENTS

| | | | |
|---|---|---|---|
| 3,260,902 | 7/1966 | Porter | 148—175UX |
| 3,327,182 | 6/1967 | Kisinko | 317—22.1UX |
| 3,335,341 | 8/1967 | Lin | 317—22.1UX |

| | | | |
|---|---|---|---|
| 3,379,584 | 4/1968 | Bean et al. | 148—175 |
| 3,380,153 | 4/1968 | Husher et al. | 148—175X |
| 3,412,460 | 11/1968 | Lin | 148—175X |
| 3,421,205 | 1/1969 | Dale | 148—175X |
| 3,457,125 | 7/1969 | Kerr | 148—187 |
| 3,460,006 | 8/1969 | Strull | 148—175X |

FOREIGN PATENTS

| | | | |
|---|---|---|---|
| 1,422,157 | 11/1965 | France | 317—22.1 |

WINSTON A. DOUGLAS, Primary Examiner

A. SKAPARS, Assistant Examiner

U.S. Cl. X.R.

29—580; 148—187; 317—235